United States Patent
Gaston et al.

(10) Patent No.: US 7,323,878 B2
(45) Date of Patent: Jan. 29, 2008

(54) GROUND TESTING METHOD AND APPARATUS

(75) Inventors: Charles A. Gaston, Lancaster, PA (US); Vaughn G. Silar, Jr., York, PA (US)

(73) Assignee: Magicground Technology LLC, York, PA (US)

( * ) Notice: Subject to any disclaimer, the term of this patent is extended or adjusted under 35 U.S.C. 154(b) by 0 days.

(21) Appl. No.: 11/271,763

(22) Filed: Nov. 10, 2005

(65) Prior Publication Data
US 2007/0103165 A1    May 10, 2007

(51) Int. Cl.
  *G01R 31/14* (2006.01)
(52) U.S. Cl. ........................ 324/510; 324/509
(58) Field of Classification Search ........ 324/508–510; 361/42
See application file for complete search history.

(56) References Cited

U.S. PATENT DOCUMENTS

| | | | |
|---|---|---|---|
| 2,791,728 A | 5/1957 | Traugott | |
| 2,895,104 A | 7/1959 | Hansen et al. | |
| 3,141,128 A | 7/1964 | Behr | |
| 3,569,826 A | 3/1971 | Burnett | |
| 3,599,179 A | 8/1971 | Arnold | |
| 3,666,993 A | 5/1972 | Legatti | |
| 3,699,392 A | 10/1972 | Lee et al. | |
| 3,737,765 A | 6/1973 | Lee et al. | |
| 3,798,540 A | 3/1974 | Darden et al. | |
| 3,810,003 A | 5/1974 | Portoulas | |
| 3,976,987 A | 8/1976 | Anger | |
| 3,978,465 A | 8/1976 | Goode | |
| 4,011,483 A | 3/1977 | Meadows | |
| 4,352,058 A | 9/1982 | Westra | |
| 4,591,941 A | 5/1986 | Gruchalla et al. | |
| 4,929,887 A * | 5/1990 | Robitaille et al. | 324/508 |
| 5,051,732 A | 9/1991 | Robitaille | |
| 5,525,908 A * | 6/1996 | Brownell | 324/508 |
| 5,627,414 A | 5/1997 | Brown et al. | |
| 5,646,810 A * | 7/1997 | Funke | 361/56 |
| 5,933,011 A | 8/1999 | Atkins | |
| 6,288,917 B1 * | 9/2001 | Redburn et al. | 363/39 |
| 6,844,736 B2 | 1/2005 | Weems | |
| 2005/0013070 A1 * | 1/2005 | Haba Armero | 361/42 |

FOREIGN PATENT DOCUMENTS
WO    9201944 A1    2/1992

* cited by examiner

Primary Examiner—Anjan Deb
Assistant Examiner—Timothy J Dole
(74) Attorney, Agent, or Firm—McNees Wallace & Nurick LLC

(57) ABSTRACT

The present invention is directed to a ground-current isolating circuit for providing a low voltage barrier between a service neutral conductor and an associated grounding system. The voltage barrier circuit comprises a first current unidirectional element and a second current unidirectional element connected in antiparallel. The unidirectional elements are preferably diodes having a characteristic threshold voltage. The current in a forward biased direction is blocked by the circuit until an applied forward biased voltage exceeds the threshold voltage. The present invention also is directed to a method of isolating a neutral conductor temporarily from an associated grounding system during testing of a structure grounding system. The method includes connecting a voltage barrier circuit in parallel with a conductor bonding the neutral conductor to the associated grounding system, then disconnecting the bonding conductor; conducting a test of the structure grounding system associated with the structure, and reconnecting the bonding conductor between the neutral conductor and grounding system.

17 Claims, 5 Drawing Sheets

GROUND TESTING METHOD AND APPARATUS

FIELD OF THE INVENTION

The present invention is directed to a method and apparatus for testing grounding systems, and more particularly to a method and apparatus for testing grounding systems in communication towers by isolating the local ground from the utility neutral while simultaneously providing an effective safety ground.

BACKGROUND OF THE INVENTION

Communication towers include signal processing equipment that is particularly susceptible to noise generated from within the power system and grounding system for the tower. Improper or poor electrical grounding can create personnel safety problems as well as interference with signal processing equipment. Communication towers are generally equipped with power supplies for signal communications, controls, lighting, air conditioning and auxiliary equipment that may introduce transient voltages into the communications signals, particularly if not properly grounded. Furthermore, tall towers attract lightning. The high current of a lightning strike can cause extreme voltage changes if the grounding system does not have a low resistance to earth ground.

The National Electrical Code® 2005 Edition (NFPA 70) (Code) defines the terms "grounding electrode", "grounding electrode conductor" and "grounding conductor" as parts of the tightly connected system referred to here simply as the "local ground". The Code also defines "grounded conductor" as the line referred to here as the "utility neutral". The local ground and utility neutral should be electrically connected at a single point, defined by the Code as the "main bonding jumper". This jumper ideally is a single screw that can be removed to isolate the utility neutral from the local ground.)

Generally, as a safety measure, or in order to eliminate sources of interference, it is necessary to test the grounding system of a communication tower periodically to ensure that there is still a low resistance between the communication tower and earth ground. In order to ensure the accuracy of the ground resistance measurements, it is necessary to eliminate possible alternate ground paths or circuits that may falsely indicate good grounding system measurements. For example, the utility AC power system neutral is normally connected to earth ground at multiple sites across its distribution network. If the ground system for the utility distribution system provides a resistance comparable to or lower than that of the local ground, a ground current measuring device will measure the lower resistance of the two systems in parallel, rather than the actual resistance of the local ground. It is therefore necessary to isolate the local grounding system from the utility neutral grounding system during testing.

The resistance of local grounding systems is commonly tested using a ground resistance meter and the "fall of potential" method. Two auxiliary electrodes are driven into the soil at significant distances along a straight line away from the ground being tested. During a normal test of a ground rod (the simplest type of local ground) the meter supplies a specific pulsating current between the ground rod under test and the most remote auxiliary electrode. A series of measurements of the voltage drops between the ground rod under test and the intermediate electrode are made by moving the intermediate electrode in steps away from the ground rod under test. The most common equipment used in the fall of potential method generates a 128 Hz pulsating current between the local ground rod and the distant auxiliary electrode. Attempts to use bandpass filters to permit 60 Hz current to flow through the grounding circuit while blocking 128 Hz current feedback through the electrical utility have been unable to filter out all of the test frequency signal. During the fall of potential test the utility neutral must disconnected from the ground rod, as the current flow on the neutral will cause an inaccurate reading.

Currently, the methods employed to measure the resistance of local grounding systems at communication towers require that the utility neutral be completely disconnected from the local ground for the communication tower and associated equipment. This eliminates the redundancy of independent grounding systems, and creates an unacceptable risk for communications companies. This lack of redundancy creates a potential danger to personnel and equipment due to the possibility of potential differences between the two grounding systems. Possible high voltage transients present a danger of electrical shock to personnel, who may inadvertently come into contact between the neutral bus and ground during a grounding system test, forming a replacement connection for the open ground to neutral connection. Similarly, sensitive communications equipment power supplies are at risk of exposure to voltage and current in excess of their rated voltage and current due to a floating neutral voltage.

Therefore there is a need for a ground testing method and device that provides effective electrical ground isolation from the utility neutral for the ground resistance meter's signals, and simultaneously provides a grounding path capable of carrying enough current to trip circuit breakers in the event of a "hot" wire shorting to a floating neutral.

SUMMARY OF THE INVENTION

The present invention is directed to a ground-current isolating circuit for providing a low voltage barrier between a utility neutral conductor and an associated local grounding system. The circuit comprises a first circuit arrangement to permit current in a first direction and a second circuit arrangement to permit current in a second direction. The first and second circuit arrangements have a characteristic threshold voltage for biasing at least one unidirectional element in each circuit arrangement to a conductive state. Current in a forward biased direction is blocked by the at least one unidirectional element until an applied forward biased voltage exceeds the threshold voltage. The circuit optionally includes a first terminal for connecting the utility neutral conductor to the ground isolating circuit, and a second terminal for connecting the associated local grounding system to the ground isolating circuit. In one embodiment, the circuit first and second circuit arrangements each comprise at least one diode.

The invention is also directed to a method of isolating a utility neutral conductor of an electrical utility service from an associated local grounding system during testing of a local grounding system associated with a structure. The method comprises connecting a voltage barrier circuit in parallel with a bonding jumper bonding the utility neutral conductor to the associated local grounding system, then disconnecting the bonding jumper after the voltage barrier circuit is in place; conducting a test of the local grounding system associated with the structure (measuring the electrical resistance between the local grounding system and earth); and reconnecting the bonding jumper between the utility neutral conductor and the associated local grounding system before removing the voltage barrier circuit.

An advantage of the present invention is improved safety due to the ability to test the local grounding system of a tower without having to disconnect it completely from the utility neutral conductor.

Another advantage is the ability to conduct sufficient current to trip a circuit breaker, in the event of failures that would make the utility neutral "hot".

Another advantage is the ability to block ground currents that interfere with testing of structure's local grounding systems.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
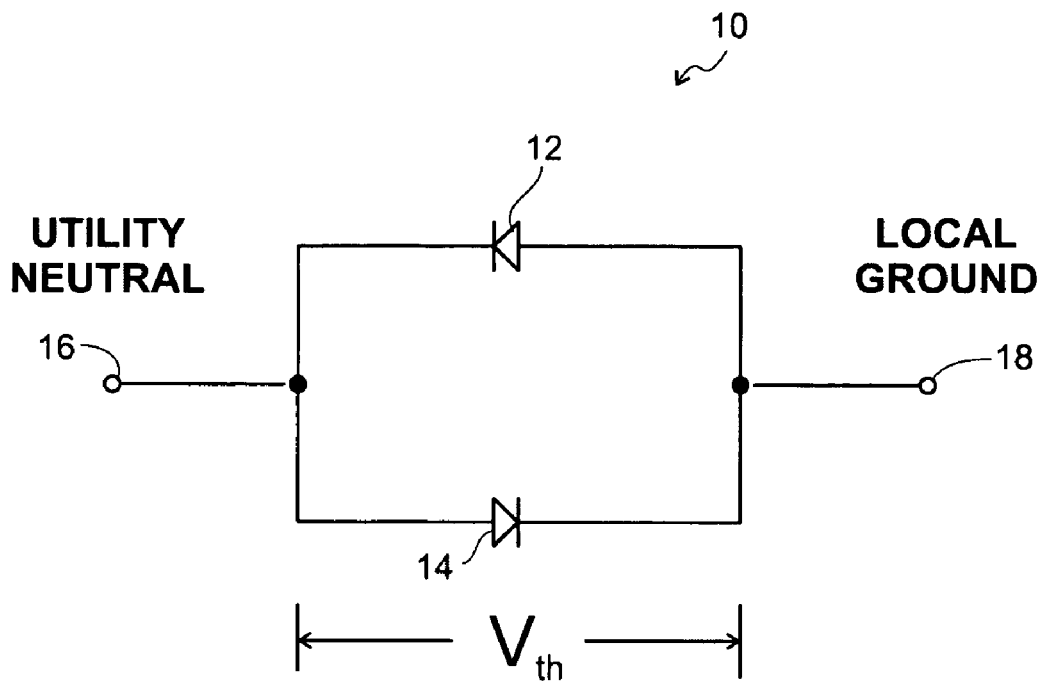
FIG. 1 is a simplified schematic diagram of one embodiment of the voltage barrier circuit of the present invention.

Referring first to FIG. 1, a basic circuit 10 applying the principle of the present invention is comprised of a pair of diodes 12, 14 connected in reverse parallel or antiparallel. When a voltage is applied across terminals 16 & 18, regardless of the polarity, current flows across the parallel diode path, provided that the voltage is equal to or greater than the forward bias voltage of the diodes. The forward bias voltage is an inherent property of all diodes. The forward bias voltage is defined as the voltage level required to forward bias the diode to a conductive state. Typically, the forward bias voltage of a single diode is very low, on the order of 0.7V, and may vary more or less according to the properties of the particular diode that is used. For the purpose of the present invention it is convenient to think of the forward bias voltage as a threshold voltage for conduction. Each single diode could be replaced by multiple diodes in series to increase threshold voltage and/or by multiple diodes in parallel to increase current-carrying capacity.

Figure 2:
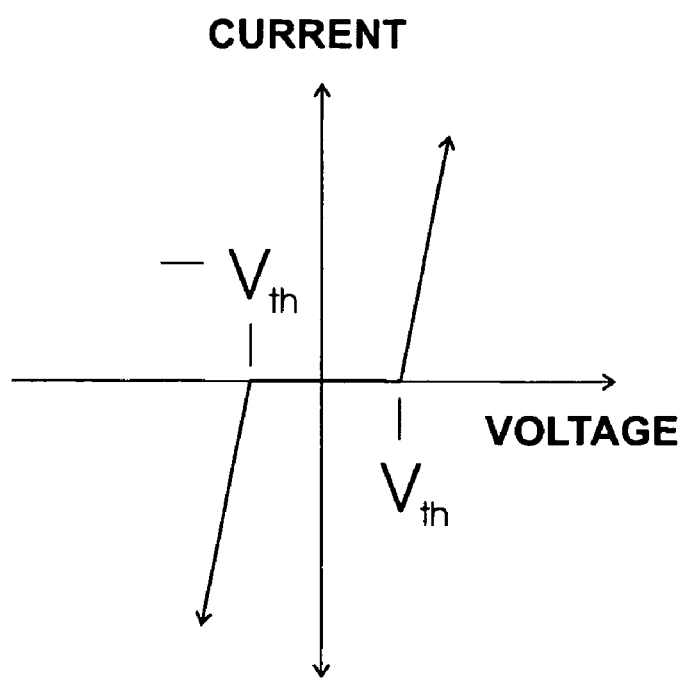
FIG. 2 is a graph showing the voltage-current characteristic of the voltage barrier circuit.

FIG. 2 is a graph showing the voltage-current profile of the present invention. $V_{th}$ represents the voltage barrier or threshold of the circuit 10. As the voltage increases from zero to $V_{th}$, the current is approximately zero. When the voltage exceeds $V_{th}$, the circuit will pass large currents with little further increase in voltage drop. As will be described in further detail below, various configurations of the voltage barrier circuits of the present invention provide a voltage barrier ranging from 0.7V to 2.8V, depending on the number of series-connected diodes in each leg of the circuit 10. Voltage differences in this range present no danger of electrical shock to personnel. Therefore, low-voltage currents generated during the testing of the local ground are blocked from circulating through the voltage barrier circuit 10, yet dangerous-voltage shorts cause enough current flow to trip circuit breakers.

Figure 3:
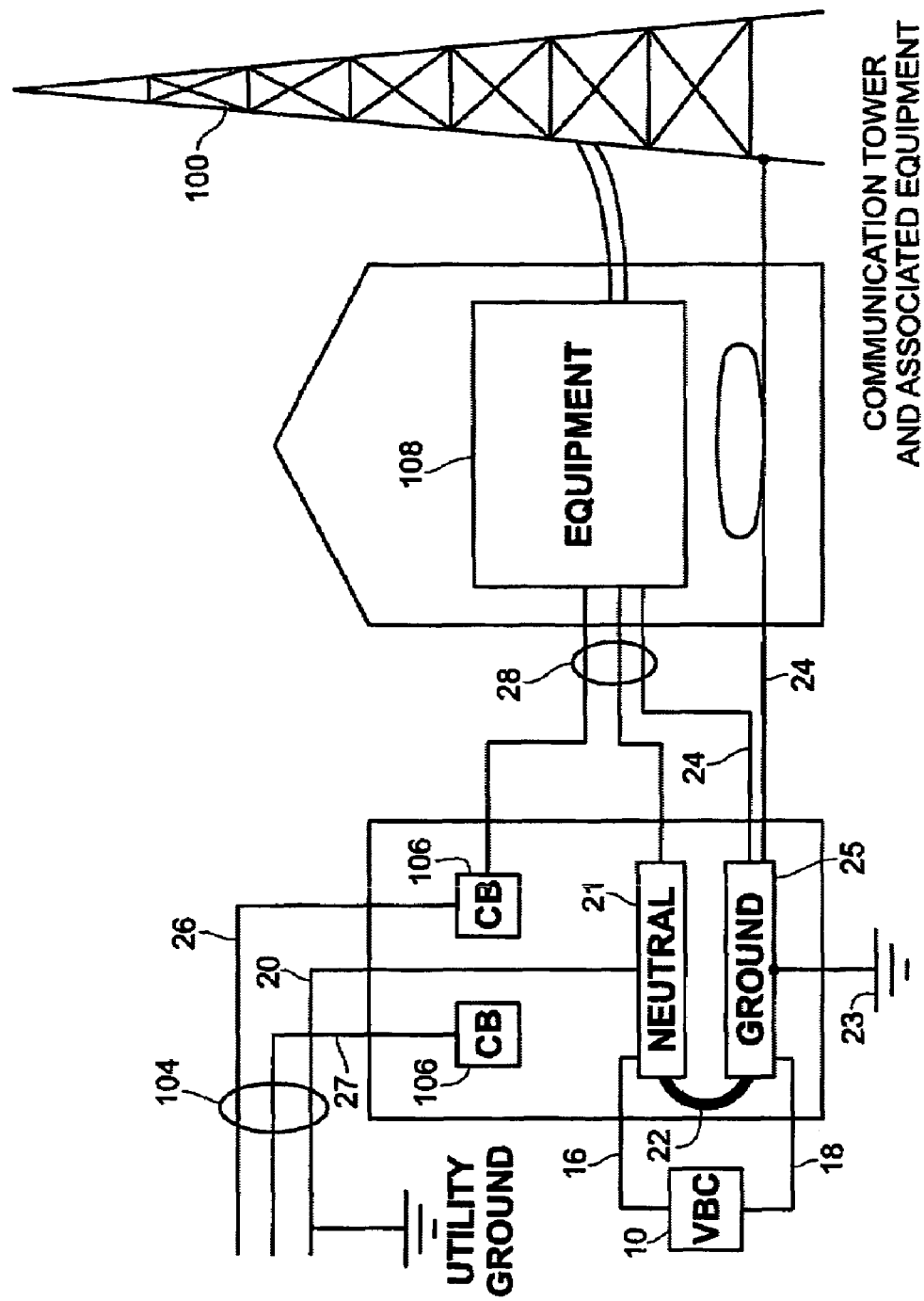
FIG. 3 is a block diagram showing the connections among the electric utility lines, the local ground and the communication tower with its associated communications equipment

FIG. 3 illustrates the connections among the electric utility lines, the local ground and the communication tower with its associated equipment. Utility power line 104 provides "hot" phases 26 and 27, plus neutral line 20. Within service panel 102 current passes through circuit breaker 106 and cable 28 to reach communications equipment 108 associated with tower 100. The return path for current reaches utility neutral 20 by way of cable 28 and neutral bus 21. The third wire in cable 28 is one of the safety ground wires 24. All safety grounds are connected to ground bus 25 and hence to the local ground 23, and should carry no current unless there is some type of failure or a lightning strike. Main bonding jumper 22 should be the only connection between neutral bus 21 and ground bus 25.

Referring to FIGS. 1 and 3, during testing of the local grounding system resistance, main bonding jumper 22 is replaced by circuit 10, with terminal 16 attached to neutral bus 21 and terminal 18 attached to ground bus 25. This effectively isolates the local grounding system 23, 24, 25 for testing purposes, yet still maintains sufficient current-carrying capacity to trip a circuit breaker 106 in case failures would otherwise put dangerous voltages on neutral bus 21.

In the event of a power system failure, e.g., a fault or a lightning strike, the voltage barrier circuit 10 permits the flow of current between the neutral bus 21 and a grounding system 23, effectively providing the safety of the solid connection 22. If the power system failure applies a voltage in excess of $V_{th}$ across the voltage barrier circuit 10, it causes one or both of the diodes 12, 14 to conduct high currents through to ground. The current capacity of circuit 10 is not unlimited, and a lightning strike could destroy it; however, proper component selection, as practiced by those skilled in the art, will yield a circuit capable of withstanding failures in the ordinary utility power circuits.

Figure 4:
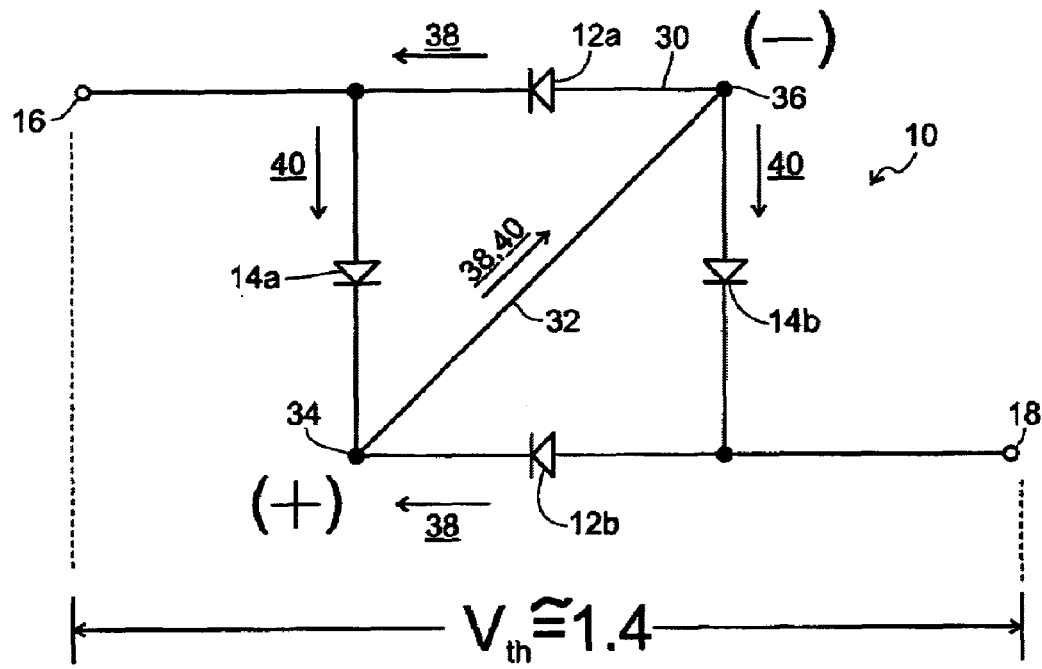
FIG. 4 shows an alternate embodiment of the voltage barrier circuit using a conventional bridge rectifier.

Referring next to FIG. 4, a rectifier bridge 30 is used as the voltage barrier circuit 10. (Catalog data indicates that conventional bridge rectifiers rated for 35 to 50 amps continuous current can handle brief surges of hundreds of amps, sufficient to trip circuit breakers.) A shorting leadwire 32 is connected between the positive terminal 34 and the negative terminal 36 of a conventional bridge rectifier. Diodes 12a and 12b are series connected in a first path 38, and diodes 14a and 14b are series connected in the reverse direction of diodes 12a and 12b in the opposite path 40. Both paths follow the same direction through shorting wire 32. The voltage barrier $V_{th}$ is approximately 1.4V, since each diode in a pair of series connected diodes requires approximately 0.7V of forward biasing voltage to become conductive, and the respective forward biasing voltage of the pair is cumulative.

Figure 5:
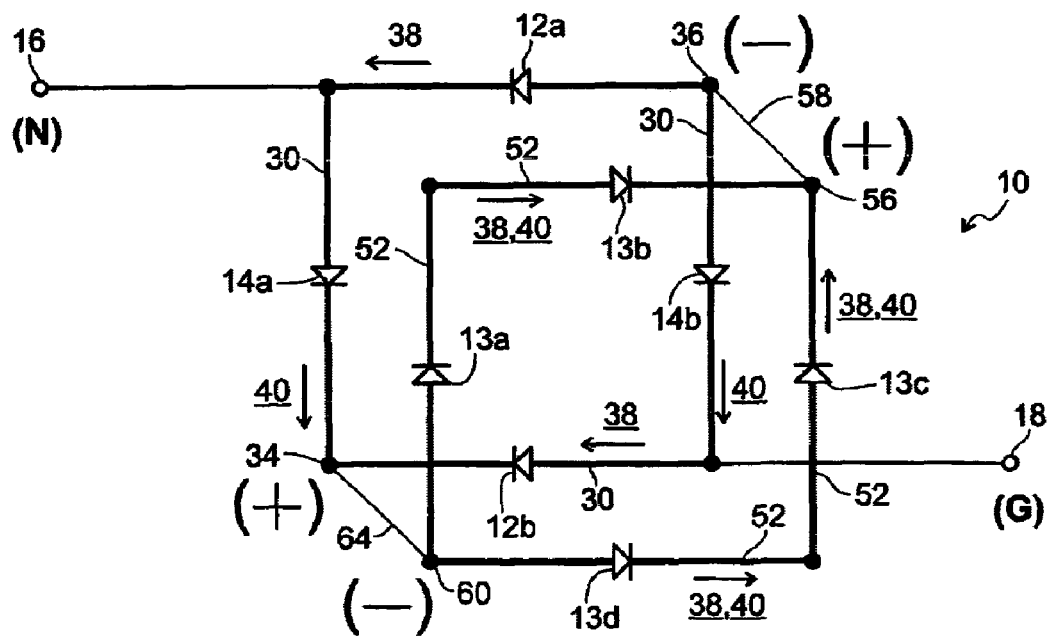
FIG. 5 shows an alternate embodiment using a pair of bridge rectifiers.

Referring next to FIG. 5, in another embodiment of the present invention the voltage barrier circuit 10 uses a second conventional bridge rectifier 52 in place of the shorting wire 32 of FIG. 4. The voltage barrier circuit 10 shown in FIG. 5 provides four-diode isolation, or in other words, $V_{th}$ is approximately equal to 2.8 V. A greater threshold voltage $V_{th}$ provides higher reliability of the ground measurements during testing because the likelihood of a potential difference of 2.8 volts in the ground testing path is less than a potential difference of 1.4V, and 1.4V difference is less likely than a 0.7V potential difference. This greater difference also allows the use of standard LEDs to indicate voltage differences approaching or exceeding $V_{th}$, as indicated in FIG. 6.

Rectifier 30 has a negative terminal 36 connected to a positive terminal 56 of rectifier 52 by a first connector 58. Rectifier 52 has negative terminal 60 connected to positive terminal 34 of rectifier 30 by a second connector 64. Diodes 12a, 13a-13d and 12b form a first series path 38 and diodes 14a, 13a-13d and 14b form a second path 40 opposite first path 38. Note that diodes 13a and 13b are connected in parallel with diodes 13c and 13d. Both pairs conduct current in the same direction for both paths, just as shorting wire 32 did in FIG. 4.

The voltage barrier circuit 10 of FIG. 5 can use off-the shelf components, i.e., bridge rectifiers 30, 52, with a pair of external connectors 58, 64, that may be easily friction-connected to the rectifiers 30,52. Thus, it is unnecessary to modify the rectifier packages as, for example, in FIG. 4, where a shorting connector 32 is inserted in the rectifier 30.

Figure 6:
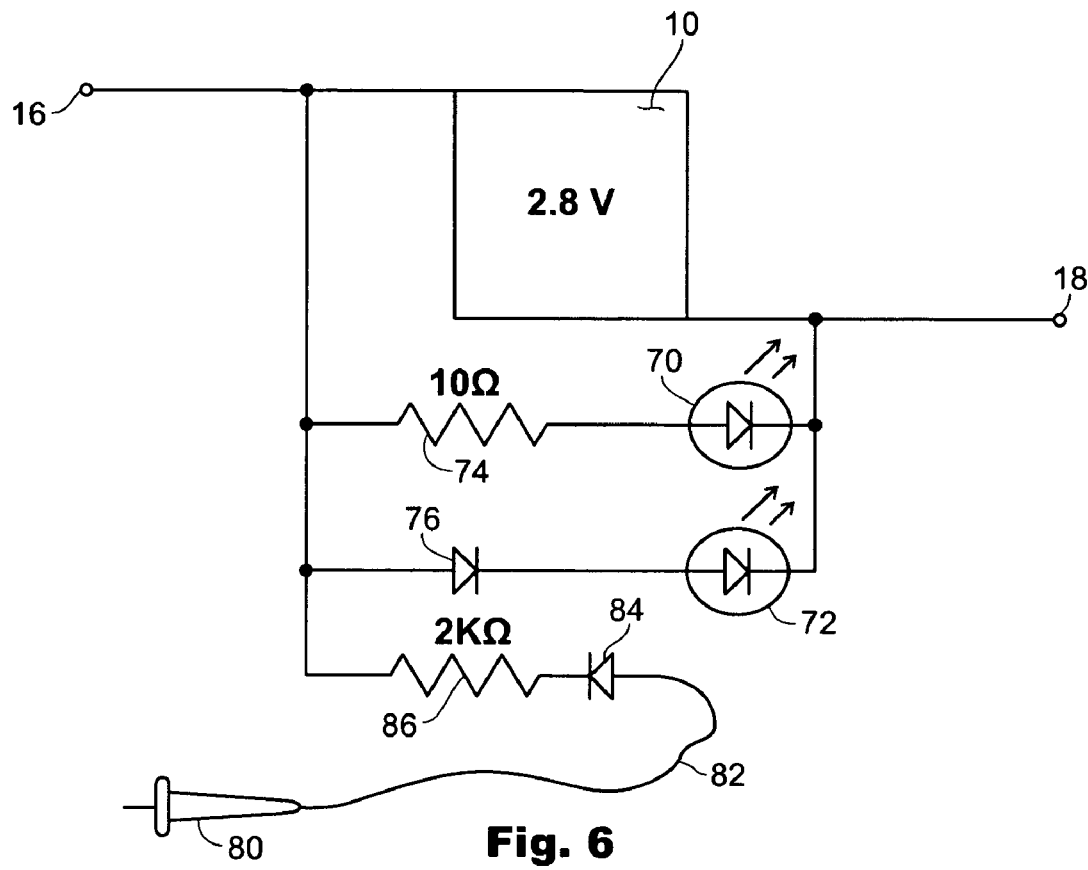
FIG. 6 shows an embodiment having LED indicators and a test probe.

Referring next to FIG. 6, the voltage barrier circuit 10 is shown with a status indicator for visual signaling to the user of voltage differences between the neutral terminal 16 and the grounding terminal 18. Two light-emitting diodes (LEDs) 70 and 72, and the voltage barrier circuit 10 are connected in parallel. First LED 70 is connected in series with a resistor 74. Preferably, resistor 74 is rated at 10 ohms. First LED 70 has a threshold voltage $V_{LED}$ of approximately 1.7 V. LED 70 illuminates if the voltage across the neutral terminal 16 and grounding terminal 18 exceeds 1.7 V. Varieties of LEDs can have greater or lesser threshold voltage parameters, and may be substituted in order to give more or less sensitive indications.

Second LED 72 is connected in series with a diode 76, the diode 76 and LED 72 being connected in parallel with both the LED 70 and the voltage barrier circuit 10. The connection of the diode 76 in series with LED 72 forms a combined threshold of approximately 2.4V for illuminating the LED 72, since the forward-bias voltage of diode 76 is approximately 0.7 V and the threshold voltage of the LED 72 is approximately 1.7 V.

The configuration of indicating LEDs 70, 72 described above may also optionally include a test probe 80, for testing the operation of the LEDs before the neutral connection 16 is made. The probe line 82 includes a diode 84, and a resistor 86 connected in series with the diode 84 and the probe 80. The diode 84 is preferably capable of withstanding at least 200 volts of reverse bias potential. Resistor 86 preferably is rated at 2 K-ohms and is capable of dissipating at least 3.5 watts of power.

Figure 7:
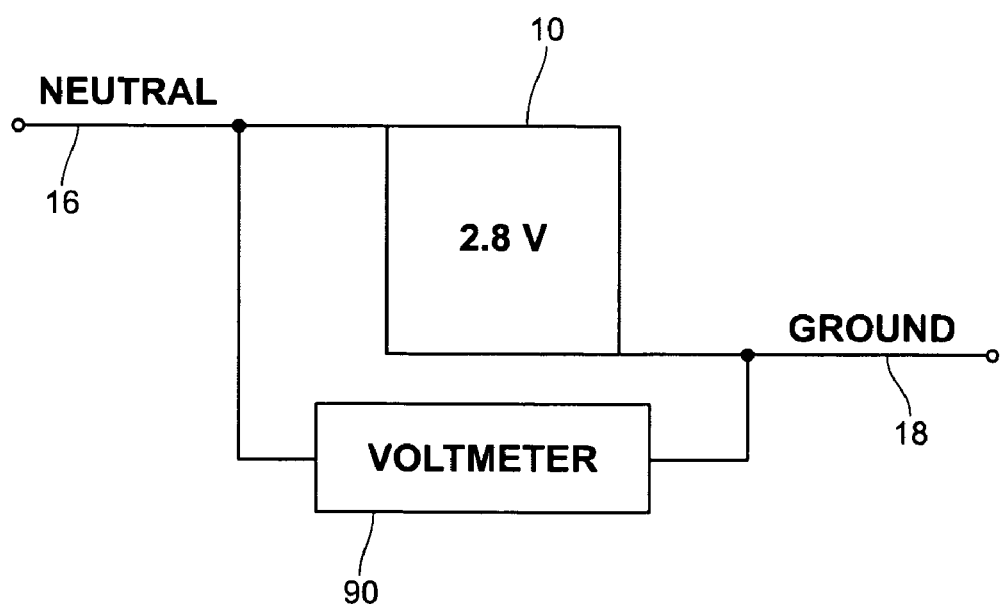
FIG. 7 shows an embodiment having a voltmeter.

Referring next to FIG. 7, another embodiment of the present invention includes a measurement of voltage difference between the service neutral 20 and grounding system 24. An AC voltmeter 90 is connected across the neutral connection 16 and the grounding connection 18, in parallel with the voltage barrier circuit 10. This provides a continuous reading of voltage difference instead of the two-step LED level indicators, but requires battery power or power derived from the AC line itself.

The voltage barrier circuit 10 of the present invention may be used to facilitate testing of a communication tower grounding system, but is not limited to such an application. Ground system testing generally is not a continuous process, but is done periodically, as required, to maintain the integrity of the communications or other grounding systems. It is therefore contemplated that the present invention may be utilized as a temporary or permanent installation, to bypass the solid bonding jumper 22. In a temporary application of the voltage barrier circuit 10, clamping devices (not shown) may be attached to the neutral bus 21 and to the ground bus 25 of the electrical utility service 102, to shunt around the solid neutral-to-ground connection 22, before removing the solid neutral-to-ground connection 22. The test of the tower 100 grounding system can then be conducted, the neutral-to-ground connection 22 restored upon completion of the ground testing, and the clamping devices removed.

Figure 8:
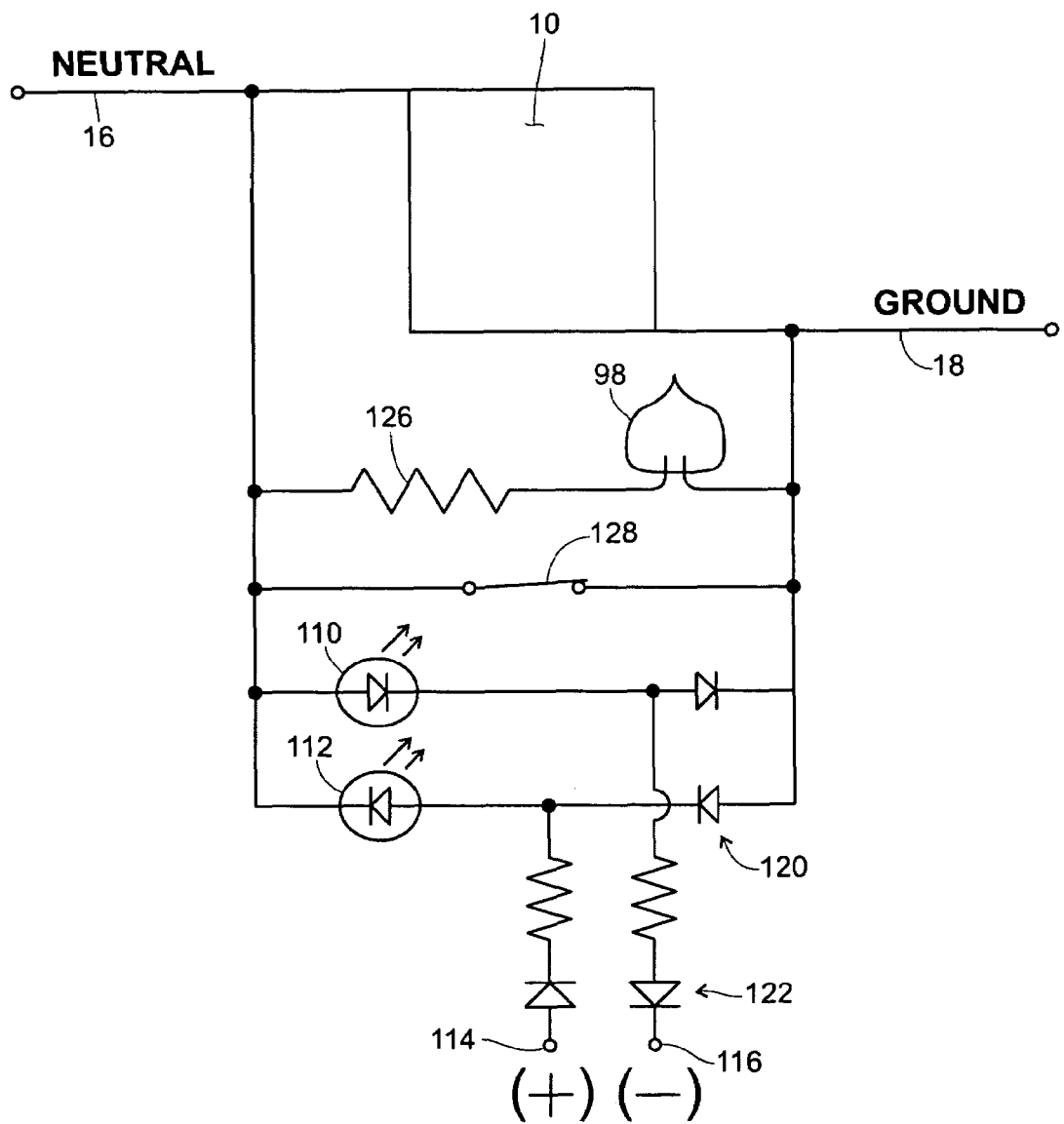
FIG. 8 shows an embodiment having visual warning LEDs, a shorting relay and test terminals.

Alternatively, the voltage barrier circuit 10 may be installed as a hard wired component of an electrical service panel. In a permanently installed embodiment, referring to FIG. 8, a neon bulb 98 may be connected in parallel with the voltage barrier circuit 10 and in series with a resistor 126. The neon bulb 98 illuminates when the neutral line voltage becomes elevated to line voltage, signaling a hazardous condition. A heavy-duty shorting switch 128 also is connected in parallel with voltage barrier circuit 10. This switch normally is closed, and is physically configured so that it cannot be accidentally left open. It is opened only during testing, and must be closed before the door to the electrical panel 102 can be closed. If the test measurements of the grounding system test are not measurably affected by opening and closing switch 128, an improper ground connection is indicated.

Also, a pair of opposed LEDs 110 and 112 is provided to indicate a significant DC or AC voltage difference between the neutral connection 16 and the ground connection 18. If only one of the LEDs 110, 112 is illuminated, a DC voltage difference is indicated. If both LEDs 110 and 112 are illuminated, an AC voltage difference is indicated. Finally, battery test terminals 114 and 116 may optionally be connected to LEDs 110 and 112, respectively. Battery test terminals 114 and 116 provide a means for testing the LEDs 110, 112, for operability. A 9 V battery may be connected across terminals 114 and 116, to test both LEDs simultaneously. Diodes 120 prevent reverse-biasing LEDs 110, 112, and resistors 122 limit the current.

It is noted that the above configurations of the voltage barrier circuit 10 are examples and the invention is not limited to the embodiments shown, as will be readily apparent to those skilled in the art. Other embodiments of the present invention may be configured, for example, by cascading combinations of the above circuits. By selectively cascading two or more configurations, various barrier voltages may be tailored to suit particular test conditions confronted in the field.

Furthermore, the invention may be practiced using devices other than diodes, such as vacuum tubes, gas discharge tubes and other power thyristors.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A ground-current isolating circuit for providing a low voltage barrier between a service neutral conductor and an associated grounding system of an electrical utility service, comprising: a first circuit arrangement to permit current in a first direction; and a second circuit arrangement to permit current in a second direction opposite said first direction, each of said first and second circuit arrangements having a positive pole and a negative pole, and a characteristic threshold voltage for biasing at least one unidirectional element in each circuit arrangement to a conductive state, and current in a forward biased direction being blocked by the at least one element for forward biased voltages less than or equal to the threshold voltage; wherein the first circuit arrangement positive pole is directly connected to the service neutral conductor and the first circuit arrangement negative pole is directly connected to the grounding system; and the second circuit arrangement positive pole is directly connected to the grounding system; and the second circuit arrangement negative pole is directly connected to service neutral conductor; wherein the first and second circuit arrangements each comprise at least two diodes, the at least two diodes being connected directly in series.

2. The circuit of claim 1, also including a first terminal for connecting the neutral conductor to the ground isolating circuit, and a second terminal for connecting the associated grounding system to the ground isolating circuit.

3. The circuit of claim 1, wherein the first and second circuit arrangements are configured from a bridge rectifier having four diodes, the first circuit arrangement comprising two diodes of the four rectifier diodes, the two diodes of the first circuit arrangement being connected directly in series, and the second circuit arrangement comprising the remaining two diodes of the four rectifier diodes, the remaining two diodes of the second circuit arrangement being connected directly in series.

4. The circuit of claim 1, wherein the first and second circuit arrangement are configured from a first and second bridge rectifier, each bridge rectifier having four diodes, wherein the first current circuit arrangement comprises at least one of the diodes from the first bridge rectifier connected directly in series with at least one of the diodes from the second rectifier, and the second circuit arrangement comprises at least one of the diodes from the first bridge rectifier connected directly in series with at least one of the diodes from the second rectifier.

5. The circuit of claim 1, wherein the circuit also comprises a visual indicating means for indicating the presence of at least one voltage difference across said circuit.

6. The circuit of claim 5, wherein the visual indicating means comprises at least one LED connected in parallel with the first and second circuit arrangements, the at least one LED indicating a forward bias voltage between the service neutral conductor and the associated grounding system when illuminated.

7. The circuit of claim 6, wherein the circuit also comprises LED test means for testing the operability of the at least one LED.

8. The circuit of claim 7, wherein the LED test means has a probe portion, a voltage divider resistor and a directional diode element connected in series with the at least one LED, the probe portion operable to apply an external test voltage to the at least one LED when the service neutral conductor is disconnected from the voltage barrier circuit.

9. The circuit of claim 1, also including voltage indicator means for providing indication of the presence of voltage difference between the neutral conductor and the grounding system.

10. The circuit of claim 9, wherein the voltage indicator means comprises a voltmeter connected in parallel with the first and second circuit arrangements.

11. The circuit of claim 1, wherein the voltage barrier circuit being permanently connected to the service neutral conductor and the associated grounding system, the circuit also comprising a line voltage indicating means for indicating that the service neutral conductor has a voltage of a phase conductor of the electric utility service.

12. The circuit of claim 11, wherein the line voltage indicating means is comprised of a first shunt path connected in parallel with the voltage barrier circuit, the first shunt path having a neon bulb connected in series with a resistor.

13. The circuit of claim 1, wherein the voltage barrier circuit being permanently connected to the service neutral conductor and the associated grounding system, the circuit also comprising a short-circuit means for bypassing the voltage barrier circuit, wherein during a test of a structure grounding system, the voltage barrier circuit may be bypassed to indicate whether the structure is improperly grounded.

14. The circuit of claim 13, wherein the short-circuit means comprises a switch configured to interfere, when open, with closing a surrounding access door.

15. The circuit of claim 13, wherein the short-circuit means comprises a switch and a mechanical timing means to reclose the switch automatically.

16. The circuit of claim 1, wherein the voltage barrier circuit being permanently connected to the service neutral conductor and the associated grounding system, the circuit also comprising a status indicating means for indicating a significant voltage difference between the service neutral conductor and the associated grounding system.

17. The circuit of claim 16, wherein the status indicating means comprises a pair of LEDs connected in reverse parallel, the LEDs being connected in parallel with the voltage barrier circuit, wherein illumination of a single LED provides indication of a DC voltage difference, and illumination of both LEDs provides indication of an AC voltage difference.

* * * * *